United States Patent [19]
Allen

[11] Patent Number: 5,463,361
[45] Date of Patent: * Oct. 31, 1995

[54] SURFACE ACOUSTIC WAVE FILTER AND METHOD

[75] Inventor: Donald E. Allen, Gilbert, Ariz.

[73] Assignee: Motorola, Inc., Schaumburg, Ill.

[*] Notice: The portion of the term of this patent subsequent to May 3, 2011, has been disclaimed.

[21] Appl. No.: 205,472

[22] Filed: Mar. 4, 1994

Related U.S. Application Data

[63] Continuation-in-part of Ser. No. 793,925, Nov. 18, 1991, Pat. No. 5,309,126.

[51] Int. Cl.⁶ ........................................... H03H 9/64
[52] U.S. Cl. .................. 333/193; 333/196; 310/313 B
[58] Field of Search .......................... 333/193, 194–196; 310/313 R, 313 A, 313 B

[56] References Cited

U.S. PATENT DOCUMENTS

| | | | |
|---|---|---|---|
| 3,582,838 | 6/1971 | DeVries | 333/194 |
| 3,596,211 | 6/1971 | Dias et al. | 333/194 |
| 3,868,608 | 2/1975 | Williams | 333/193 |
| 4,384,264 | 5/1983 | Kadota | 333/193 |
| 4,468,642 | 8/1984 | Hikita | 333/193 |
| 4,492,940 | 1/1985 | Hikita | 333/194 |
| 4,544,857 | 10/1985 | Shimizu et al. | 310/313 A |
| 4,649,357 | 3/1987 | Nagai et al. | 333/196 |
| 4,734,664 | 3/1988 | Hikita et al. | 333/193 |
| 4,803,449 | 2/1989 | Hikita et al. | 333/193 |
| 4,931,755 | 6/1990 | Sakamoto et al. | 333/193 |
| 5,130,681 | 7/1992 | Ohnuki et al. | 333/194 |
| 5,309,126 | 5/1994 | Allen | 333/193 |

FOREIGN PATENT DOCUMENTS

| | | |
|---|---|---|
| 0022745 | 2/1979 | European Pat. Off. . |
| 0401737 | 12/1990 | European Pat. Off. . |
| 0091311 | 4/1991 | European Pat. Off. . |

OTHER PUBLICATIONS

"Saw Filters Employing Interdigitated Interdigital Transducers, IIDT", by Merion Lewis, Royal Signals and Radar Establishment, Malvern, Worcestershire, United Kingdom, 1982 Ultrasonic Symposium.

"Miniature Saw Antenna Duplexer For Portable Telephone", by M. Hikita et al., Central Research Laboratory, Hitachi, Ltd., Kokubunji, Tokyo, 185 Japan, 1987 IEEE.

*Primary Examiner*—Robert J. Pascal
*Assistant Examiner*—Darius Gambino
*Attorney, Agent, or Firm*—Frederick M. Fliegel

[57] ABSTRACT

An electronic apparatus for receiving and filtering high frequency waves comprises a sequence of T electro-acoustic transducers each having multiple interdigital electrode fingers and a centerline located equidistant between its outermost electrode fingers. For a centerline-to-centerline distance of a first adjacent pair of transducers $D_1$, and centerline-to-centerline distances of other adjacent pairs of transducers $D_2$ to $D_{T-1}$, then at least some of $D_2$ to $D_{T-1}$ differ from $D_1$ by a non-integral number of wavelengths. The transducer array is symmetrical about a centerline and the number of fingers in each transducer varies, with an input or output transducer closer to either end of the sequence having more fingers than a like kind transducer nearer the center.

20 Claims, 4 Drawing Sheets

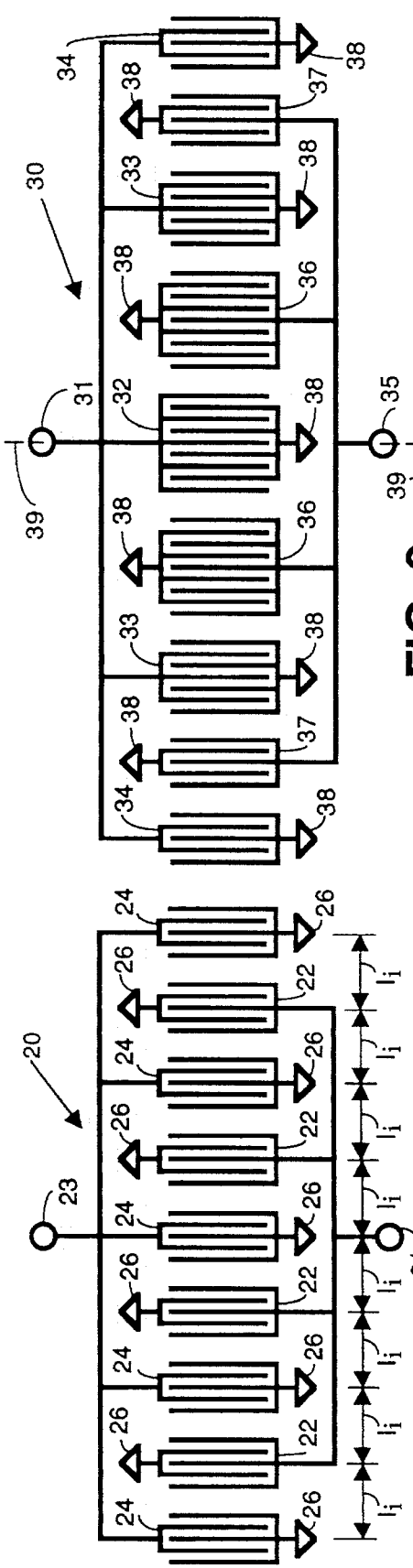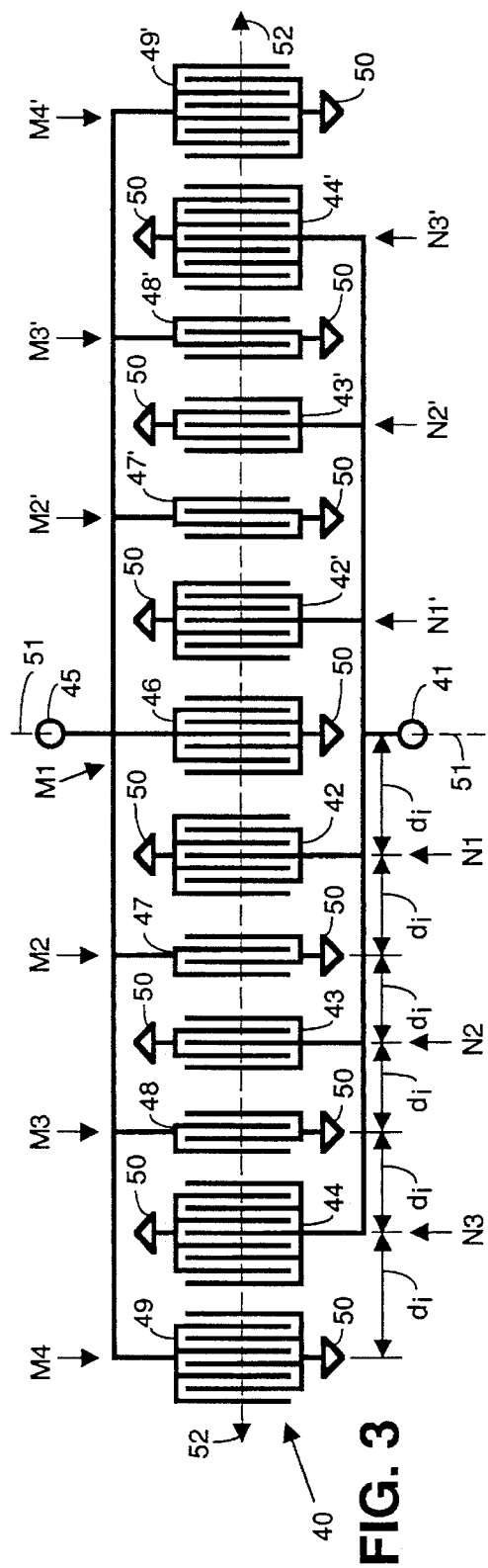

SURFACE ACOUSTIC WAVE FILTER AND METHOD

CROSS REFERENCE TO RELATED APPLICATION

This application is a continuation-in-part of application Ser. No. 07/793,925, filed Nov. 18, 1991, now U.S. Pat. No. 5,309,126, issued May 3, 1994, which is assigned to the same assignee as the present application.

FIELD OF THE INVENTION

The present invention concerns an improved means and method for surface acoustic wave filters and apparatus using such filters.

BACKGROUND OF THE INVENTION

Modern portable radios and other electronic equipment require filters of very compact form and good electrical properties. Surface acoustic wave (SAW) filters are especially desirable for such purposes.

SAW filters are known in the prior art. For example, an article by Meirion Lewis entitled, "Saw Filters Employing Interdigitated Interdigital Transducers, IIDT", Ultrasonics Symposium, 1982, pages 12–17, describes SAW filters using interdigital transducers of interdigital electrodes on piezoelectric materials, each transducer having the same number of electrode fingers. Further, U.S. Pat. No. 4,492,940 to Hikita describes an acoustic surface wave bandpass filter using a linear array of alternate I/O transducers arranged in sequence, each having multiple interdigital electrode fingers, where the number of fingers in the input transducers and the number of fingers in the output transducers decreases from the center to the end of the array. Additionally, U.S. Pat. No. 4,649,357 to Nagai et al., describes a surface acoustic wave filter using a linear array of alternate I/O transducers arranged in sequence, each having multiple interdigital electrode fingers, where the distances (along the array) between the centerlines of adjacent transducers differ by an integral multiple (0, ±1, ±2, etc.) of wavelengths, and U.S. Pat. No. 4,931,755 to Sakamoto et al., describes use of an auxiliary capacitive transducer or other shunt capacitance to adjust the filter cut-off above the pass-band. The above-listed patents are incorporated herein by reference.

Despite the considerable effort by many researchers, numerous problems remain in connection with SAW filters, as for example, setting the optimum input/output (I/O) impedance levels, optimizing the spectral response, reducing internal reflections within the filter, and simplifying the fabrication process. These features of SAW filters affect their utility and performance in electronic apparatus. Hence, there continues to be an ongoing need for improved filters and filter applications.

As used herein the abbreviation SAW is intended to stand for "surface acoustic wave". As used herein the word "filter", singular or plural, is intended to include any element having a frequency dependent transfer function, and the words "SAW filter", singular or plural, are intended to refer to elements employing surface acoustic waves and having a frequency dependent transfer function.

SUMMARY OF THE INVENTION

The present invention provides an improved means and method for electronic devices and apparatus including SAW devices, and especially SAW filters and improved apparatus based thereon.

According to a first embodiment of the present invention, there is provided an electronic apparatus comprising a SAW filter including, in general terms, a substrate for propagating acoustic waves on which are arranged in a direction of wave propagation, a sequence of input transducers and output transducers, each transducer having a number of interdigitated electrode fingers, wherein beginning at one end of the sequence, the number of fingers in a first transducer is larger than the number of fingers in another transducer further along the sequence.

According to another embodiment of the present invention, there is provided an electronic apparatus comprising a SAW filter having a centerline-to-centerline separation of an adjacent pair of transducers of the SAW filter which differs from a centerline-to-centerline separation of another adjacent pair of transducers by a non-integral number of wavelengths of the acoustic wave.

In a preferred embodiment of the SAW filter, beginning at one end of the sequence, the number of fingers in a first input (or output) transducer is larger than the number of fingers in another input (or output) transducer further along the sequence. The sequence is desirably symmetric about a centerline normal to the direction of propagation of the acoustic wave. It is further desirable that where a transducer in the sequence contains an even number of electrode fingers, an adjacent transducer contains an odd number of electrode fingers.

There is further provided a method for forming an apparatus including a SAW filter, which method comprises providing a substrate for propagating acoustic waves and providing on the substrate a sequence of input transducers and output transducers, wherein each transducer has a number of interdigitated electrode fingers, wherein beginning at one end of the sequence, the number of fingers in a first transducer is larger than the number of fingers in another transducer located further along the sequence.

In a preferred embodiment of the method, the step of providing the transducers comprises providing transducers having predetermined centerlines normal to the direction of acoustic wave propagation, wherein each centerline is located half way between outer edges of first and last electrode fingers of the transducer, and wherein centerlines of a first adjacent pair of transducers are a distance $D_1$ apart and centerlines of other adjacent pairs of transducers are distances $D_2$ to $D_{T-1}$ apart. Here, T is the number of transducers, and at least one of $D_2$ to $D_{T-1}$ differs from $D_1$ by a non-integral number of wavelengths.

It is further desirable that the step of providing the transducers comprise providing an input transducer with an even number of electrode fingers and another input transducer with an odd number of electrode fingers, and providing an output transducer with an odd number of electrode fingers, or vice versa as regards the designations of input and output.

In a still further embodiment, there is further provided an improved radio having therein one or more of the above-described filters.

BRIEF DESCRIPTION OF THE DRAWINGS

FIG. 1 is a highly simplified schematic drawing of the transducer arrangement of a first SAW filter according to the prior art;

FIG. 2 is a highly simplified schematic drawing of the transducer arrangement of another SAW filter according to the prior art;

FIG. 3 is a highly simplified schematic drawing of the transducer arrangement of a SAW filter according to an embodiment of the present invention;

DETAILED DESCRIPTION OF THE DRAWINGS

Figure 4:
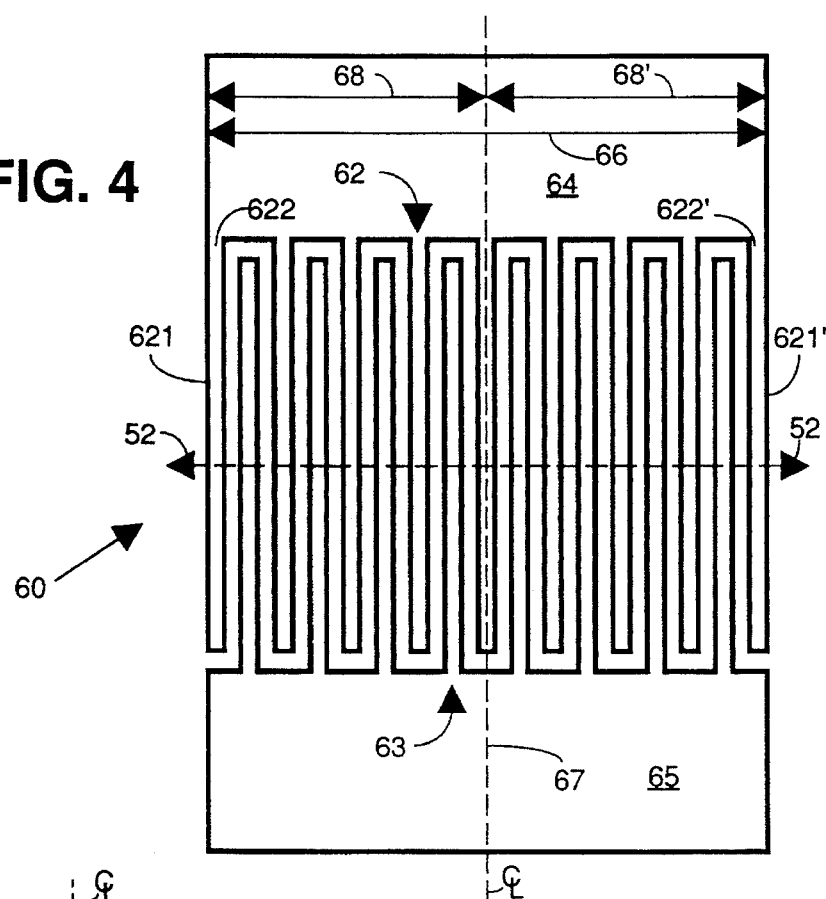
FIGS. 4 and 5 are plan views illustrating transducers such as are used in the present invention, having odd and even numbers of electrode fingers, respectively, and showing the locations of the centerlines thereof.

FIG. 1 is a highly simplified schematic drawing of the transducer arrangement of SAW filter 20 according to the prior art as described, for example, by Nagai, supra. Filter 20 comprises input terminal 21 connected to a plurality of input transducers 22 and output terminal 23 connected to a plurality of output transducers 24. Each transducer 22, 24 is composed of a number of interdigital metal fingers coupled respectively to input 21 and output 23 and to ground 26. Input transducers 22 and output transducers 24 are themselves interdigital. Thus, filter array 20 is formed by a sequence of alternating input 22 and output 24 transducers, each output transducer 24 having the same number of fingers and each being spaced from the other transducers 22, 24 by distances $l_1=l_1$ to $l_{T-1}$, where T is the number of transducers. Nagai teaches that it is desirable that the distances $l_i$ be related such that for arbitrary distance $l_1=m_1 \cdot L$ where ml is a positive real number and L is the acoustic wavelength, then the other distances $l_2$ to $l_{T-1}$ satisfy $l_i=l_1+m_i \cdot L$ where $m_i$ is an arbitrary integer (0, ±1, ±2, etc.), for i=2, 3, 4, . . . T–1. Thus, the distances $l_i$ must be equal or differ by an integral number of wavelengths L.

FIG. 2 is a highly simplified schematic drawing of the transducer arrangement of another prior art SAW filter 30 according to Hikita, supra. Filter 30 has input terminal 31 connected to input transducers 32, 33, 34 symmetrically arranged around the filter centerline 39. Filter output 35 is connected to output transducers 36, 37 which are also grouped symmetrically around filter centerline 39. The transducers are also connected to ground lead 38. The interdigital array of transducers makes filter 30.

Hikita teaches that the number of electrode fingers in the transducers desirably taper as one moves from transducers located at or near the centerline toward transducers located at or near the ends of filter 30. That is, if $N_1$, $N_2$, and $N_3$ are the number of fingers respectively in input transducers 32, 33, 34 and $M_1$ and $M_2$ are the number of electrode fingers in output transducers 36, 37 respectively, then $N_1 \geq N_2 \geq N_3$ and $M_1 \geq M_2$.

While the above described prior art arrangements provide filtering action, they still suffer from some disadvantages well known in the art. For example, power handling capability is limited, it is difficult to optimize I/O impedance levels, and the spectral response of the filter is difficult to adjust. For this reason, such filters are still difficult to make and use or have less than the desired performance in electronic circuits, especially radios.

The foregoing and other problems are ameliorated or overcome by the structure and method of the present invention which is illustrated in various forms in FIG. 3–7. Unless specifically noted otherwise, the designations "input" and "output" (and the abbreviation "I/O"), whether singular or plural, with respect to the present invention are intended to be arbitrary designations for purposes of illustration and discussion, and can be interchanged.

Refer now to FIG. 3, a highly simplified schematic drawing of the transducer arrangement of SAW filter 40 according to an embodiment of the present invention. Filter 40 comprises input 41 coupled to a plurality of transducers 42, 42', 43, 43', 44, 44' having numbers of interdigital electrode fingers $N_i$ denoted $N_1$, $N_1'$, $N_2$, $N_2'$, $N_3$, $N_3'$, respectively. Filter 40 further comprises output 45 coupled to transducers 46, 47, 47', 48, 48', 49, 49' having numbers of interdigital electrode fingers $M_j$ denoted $M_1$, $M_2$, $M_2'$, $M_3$, $M_3'$, $M_4$, $M_4'$, respectively. Transducers 42–44' and 46–49' are arranged in a sequential array, so that the input-output transducers desirably alternate as one progresses along the array. For example, starting at one end, a sequence of output transducers 49, 48, 47, 46, 47', 48', 49', alternate with a sequence of input transducers 44, 43, 42, 42', 43', 44' to form the sequence output-input-output-input-output-input- etc., (e.g., transducers 49, 44, 48, 43, 47, 42, etc.) making up the exemplary SAW device.

As indicated on FIG. 3, the transducer's electrode "fingers" are interdigitated or interleaved and desirably perpendicular to direction 52 of propagation of the acoustic wave. For a given transducer, the electrode fingers facing in a first direction are coupled to the input (or output) and the remaining electrode fingers of that transducer (facing in the opposite direction) are coupled to a common terminal, as for example ground connection 50.

The transducers themselves are also interleaved or interdigitated, that is, the ground contacts to the transducers are on one side of the array for the input transducers and on the other side of the array for the output transducers and the conductors leading to the input terminal approach only from one side of the array and the conductors leading to the output terminal approach from the other side of the array. This is not essential but is desirable and provides a convenient conductor layout.

Further, the transducers of filter 40 are desirably but not essentially symmetrical about centerline 51 passing through the center of filter array 40 perpendicular to acoustic wave direction 52. For convenience of explanation and without intending to be limiting, symmetry about centerline 51 is assumed in the discussion that follows and reference to transducers 42–49 is intended to include transducers having corresponding primed reference numbers.

The number of electrode fingers $N_i$, $M_j$ in the transducers desirably varies according to the position of the transducer in the transducer array. It has been found that excellent electrical properties are obtained when the numbers of electrodes in the transducers varies such that the outermost transducers have more electrode fingers than the inner transducers. Starting at one end of the array and progressing towards centerline 51, the number of fingers in the first input (or output) transducer is larger than the number of fingers in the next encountered input (or output) transducer. In a preferred embodiment the number of fingers $N_i$, $M_j$ in the outermost input or output transducer is also larger than the number of fingers in the most centrally located input or output transducer. For example, $N_3 \geq N_2$ and/or $M_4 \geq M_3$, and preferably, $N_3 \geq N_1$ and/or $M_4 \geq M_1$.

The number of fingers in a central transducer may be an odd number including an integer having a value in the range from between thirty and sixty. The odd number usefully is an integer having a value in the range from between forty four and forty eight.

A first transducer immediately adjacent the central one desirably is separated therefrom by a gap between an outermost edge of an outer electrode of the central one and an outermost edge of an adjacent outer electrode of the first transducer. The gap usefully includes a width in the range from three fourths to one wavelength.

The first transducer immediately adjacent the central one is usefully separated therefrom by a gap between an outermost edge of an outer electrode of the central one and an outermost edge of an adjacent outer electrode of the first transducer. The gap usefully includes a width of substantially eighty five percent of a wavelength.

Alternatively, the first transducer immediately adjacent the central one is desirably separated therefrom by a gap between an outermost edge of an outer electrode of the central one and an outermost edge of an adjacent outer electrode of the first transducer. The gap usefully includes a width of substantially ninety three percent of a wavelength.

The surface acoustic wave filter includes a sequence of T input and output transducers including a plurality of input transducers and a plurality of output transducers, each having multiple interdigital electrode fingers wherein T is the number of electro-acoustic transducers and T is desirably equal to an odd number between 6 and 25.

Alternatively, the surface acoustic wave filter includes a sequence of T input and output transducers including a plurality of input transducers and a plurality of output transducers, each having multiple interdigital electrode fingers wherein T is the number of electro-acoustic transducers and T is usefully equal to thirteen.

The following is an example of a filter having thirteen transducers (T=13) with a center frequency of about 911 MHz, a pass-band of approximately 35±2 MHz with stop-bands on either side, a pass-band insertion loss of about 3 dB and a stop-band rejection of at least 20 dB. The exemplary filter is symmetrical about centerline 51. The number of electrode fingers n in the various transducers is shown in Table I below. As an aid to relating this example to the transducers in FIG. 3, the reference numerals of the transducers of FIG. 3 are shown in parenthesis.

TABLE I

NUMBER OF ELECTRODE FINGERS IN DIFFERENT TRANSDUCERS

| TRANSDUCER | n | TRANSDUCER | n |
|---|---|---|---|
| $N_1$ (42, 42') | = 61 | $M_1$ (46) | = 45 |
| $N_2$ (43, 43') | = 55 | $M_2$ (47, 47') | = 40 |
| $N_3$ (44, 44') | = 65 | $M_3$ (48, 48') | = 40 |
|  |  | $M_4$ (49, 49') | = 48 |

The numbers of fingers in the primed and unprimed transducers are equal in this example. This is preferred.

It is also desirable that the distance between the centerlines of adjacent pairs of transducers be adjusted so as to not differ by an integral multiple of acoustic wavelengths. This is explained below in more detail.

As shown on FIG. 3, adjacent pairs of transducers, e.g., 49/44, 44/48, 48/43, 43/47, 47/42 and 42/46, are separated by transducer centerline-to-centerline distances $d_i$, which are in general not equal. Where T is the total number of transducers in array 40, the distances $d_i = d_1, d_2, d_3, \ldots d_{T-1}$ for i=1, 2, 3, ... T−1 are not necessarily equal. With respect to the parameter d, the index "i" is intended to be arbitrary in the sense that any of the distances $d_i$ can be assigned as i=1, and any other as i=2, and so on without a particular order or sequence being implied. Determination of the locations of the centerlines of the transducers is explained more fully in connection with FIGS. 4–6.

In another embodiment, a surface acoustic wave filter usefully includes a sequence of T electro-acoustic transducers including a plurality of input transducers and a plurality of output transducers. Each transducer includes multiple interdigital electrode fingers wherein T is the number of electro-acoustic transducers. Each electro-acoustic transducer has a predetermined number of interdigital electrode fingers and each electro-acoustic transducer is either an input or an output transducer. An input transducer closer to an end of the sequence has more interdigital electrode fingers than another input transducer closer to a center of the sequence, or an output transducer closer to an end of the sequence has more interdigital electrode fingers than another output transducer closer to the center of the sequence. A central transducer has an odd number of interdigital electrode fingers wherein the odd number is an odd number between thirty four and sixty.

The odd number desirably but not essentially is an odd number chosen from the group consisting of forty-five and forty-seven.

In one embodiment, the transducer adjacent the central transducer desirably includes a number of electrodes, the number chosen from the group consisting of sixty-one and sixty-five.

FIG. 4 is a plan view illustrating transducer 60 having an odd number of electrode fingers therein. Electrode fingers 62 extend inwardly in a first direction from first common connection 64 and electrode fingers 63 extend inwardly in the opposite direction from common connection 65. Fingers 62, 63 are interdigital, that is, they interleave. Electrode fingers 62, 63 are typically one-quarter wavelength wide and are typically spaced apart by about one-quarter wavelength so that an electrical potential can be created therebetween. Transducer 60 has width 66 extending between outer-most edges 621, 621' of fingers 622, 622' of finger group 62 extending from connection 64. Transducer 60 has centerline 67 which is normal to wave propagation direction 52. Centerline 67 is half way between the outermost edges of fingers 621, 622, that is, the distances 68, 68' are equal. It will be noted that for a transducer with an odd number of fingers, centerline 67 falls on an electrode finger.

The number n of electrode fingers in transducer 60 is defined as the number of fingers extending from common connection 64 plus the number of electrode fingers extending from common connection 65. While transducer 60 is shown as having n=17, this is merely for convenience of illustration and not intended to be limiting and larger or smaller numbers of fingers may be used, as is shown for example in Table I above. Transducer 60 is intended to illustrate a convenient transducer having multiple electrode fingers where n is an odd number.

In an alternative embodiment, a method for forming an electronic apparatus comprising a filtering function, includes steps of (i) providing a substrate for propagating acoustic waves and (ii) disposing on the substrate a sequence of input transducers and output transducers. Each transducer includes a number of interdigitated electrode fingers, wherein the number of fingers in a first input or output transducer at or near a first end of the sequence is larger than the number of fingers in another input or output transducer more remote from the first end.

The disposing step desirably includes a step of disposing a central transducer in the sequence of input and output transducers. The central transducer usefully comprises an odd number of electrodes.

The step of disposing a central transducer in the sequence of input and output transducers usefully includes a step of disposing a central transducer including a number of electrodes. The number is desirably chosen from the group of forty-five and forty-seven.

Figure 5:
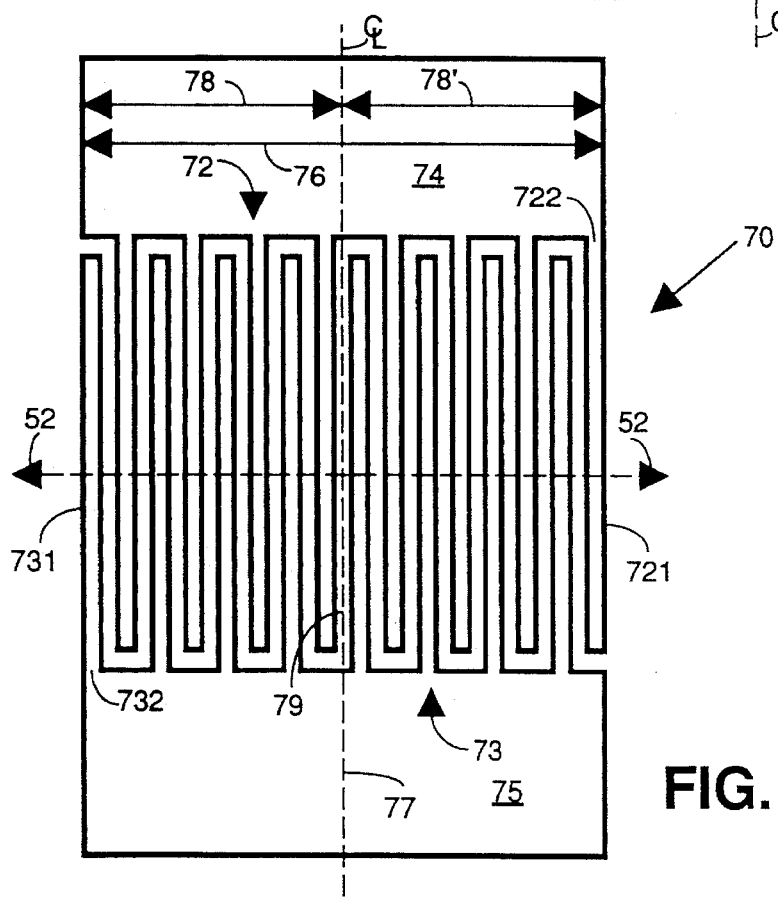

FIG. 5 is a plan view illustrating transducer 70 having an even numbers of electrode fingers therein. Electrode fingers 72 extend inwardly in a first direction from first common connection 74 and electrode fingers 73 extend inwardly in the opposite direction from common connection 75. Fingers 72, 73 are interdigital, that is, they interleave. Electrode fingers 72, 73 are typically one-quarter wavelength wide and are typically spaced apart by about one-quarter wavelength so that an electrical potential can be created therebetween. Transducer 70 has width 76 extending between outer-most edges 721, 731 of fingers 722, 732. Finger 722 belongs to finger group 72 extending from common connection 74 and finger 732 belongs to finger group 73 extending from common connection 75.

Transducer 70 has centerline 77 which is normal to wave propagation direction 52. Centerline 77 is half way between the outermost edges 721, 731 of fingers 721, 731, that is, the distances 78, 78' are equal. It will be noted that for a transducer with an even number of fingers, centerline 77 falls between electrode fingers in space 79.

The number n of electrode fingers in transducer 70 is defined as the number of fingers extending from common connection 74 plus the number of electrode fingers extending from common connection 75. While transducer 70 is shown as having n=16, this is merely for convenience of illustration and not intended to be limiting and larger or smaller numbers of fingers may be used, as is illustrated for example in Table I above. Transducer 70 is intended to illustrate a convenient transducer having multiple electrode fingers where n is an even number.

Figure 6:
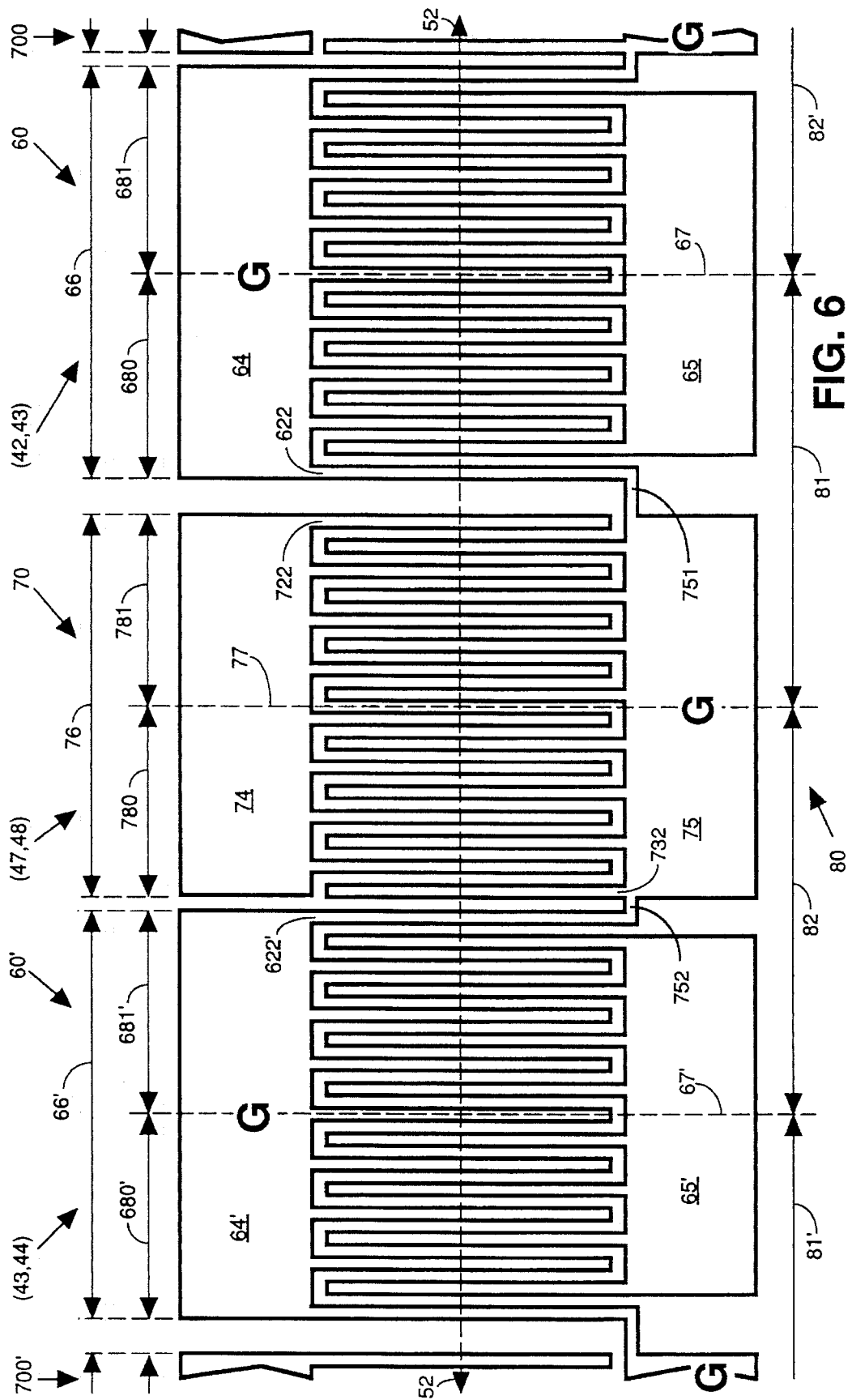
FIG. 6 is a plan view illustrating multiple transducers such as are used in the present invention, arranged in a sequential array and illustrating the relationships between adjacent transducers, the centerlines thereof and the direction of propagation of the acoustic wave.

FIG. 6 is a plan view illustrating multiple transducers such as are used in the present invention, arranged in a sequential array 80 and illustrating the relationships between adjacent transducers 60, 70, 60', the centerlines thereof 67, 77, 67' and direction 52 of propagation of the acoustic wave. FIG. 6 shows transducer array 80 making up a portion of filter 40 (FIG. 3). Array 80 comprises even number electrode transducer 70 sandwiched between odd-number electrode transducers 60, 60', such as are shown for example in FIGS. 3–5. Transducers 60 (odd), 70 (even), 60' (odd) in FIG. 6 are intended to exemplify various of the transducers in the filter of FIG. 3 having various numbers n of electrode fingers which are not necessarily the same. For example, transducers 60, 70, 60' of FIG. 6 exemplify transducers 42 (e.g., n=61), 47 (e.g., n=40) and 43 (e.g., n=55) respectively and in either order, or transducers 43 (e.g., n=55), 48 (e.g., n=40) and 44 (e.g., n=65) respectively and in either order, or their primed counterparts. Corresponding to the arrangement of FIG. 3, connections 64', 75, 64 indicated by the letter "G" are coupled to common or ground lead 50 of filter 40, and connection 74 to output 51 and connections 65', 65 to input 41 of filter 40.

Transducers 60, 60' have widths 66, 66' and centerlines 67, 67' defined in the same manner as for FIG. 4, that is, distances 680 and 681 are equal and distances 680' and 681' are equal. Transducer 70 has width 76 and centerline 77 defined in the same manner as for FIG. 5, that is, distances 780 and 781 are equal. Centerlines 67, 77, 67' are separated by distances 81 and 82 respectively. Analogous distances to other transducers 700, 700' lying to the left and right, respectively, of transducers 60, 60' are denoted as 82' and 81' respectively. In FIG. 6 transducers 700 and 700' are illustrated as being further transducers with n even. However, this is merely for convenience of illustration and not intended to be limiting, since adjoining further transducers may have n even or odd.

Distances 81', 82, 81, 82' illustrate the manner in which distances $d_i$ in FIG. 3 are intended to be measured, that is, between the centerlines of the respective adjacent transducers. In the exemplary 13 transducer filter described earlier in connection with Table I and FIG. 3, the preferred centerline-to-centerline (CTC) distances are typically as shown in Table II:

TABLE II

| TRANSDUCER PAIR REFERENCE NUMBERS | CTC DISTANCES $d_i$ |
| --- | --- |
| 46–42 | $m_1 \cdot L + x$ |
| 42–47 | $m_2 \cdot L + x - L/4$ |
| 47–43 | $m_3 \cdot L + x + L/4$ |
| 43–48 | $m_4 \cdot L + x - L/4$ |
| 48–44 | $m_5 \cdot L + x + L/4$ |
| 44–49 | $m_6 \cdot L + x - L/4$. |

The CTC distances for the primed reference numbers are the same. The quantity x is a design parameter and a positive real number. The quantity L is the acoustic wavelength and $m_1 \ldots m_6$ are integers. Values of x about x=0.4L are suitable, with values in the range of about 0.2L to 0.6L being useful.

Useful values of $m_1 \ldots m_6$ are determined by the number of fingers in adjacent transducers and their separation. There must be sufficient space between centerlines to at least accommodate the numbers of fingers in the adjacent transducers. Typically, the finger width and finger separation in the direction of wave propagation are about L/4 so that the distance from the leading edge of one finger to the leading edge of the next finger is about L/2. The larger the number n of fingers, the larger must be the CTC spacing of adjacent transducers. Hence, minimum values of $m_1 \ldots m_6$ are related to $d_i$ and n. Those of skill in the art will understand how to determine such minimum values. In general, it is desirable that $m_1 \ldots m_6$ be close to or equal to the minimum values.

As shown in Table II, at least some of the CTC distances $d_i$ of the preferred embodiment of the present invention differ by non-integral multiples of the acoustic wavelength L, irrespective of which distance $d_i$ is chosen as a basis for comparison.

Table III provides a set of values for number of finger pairs $N_{xy}$ and inter-transducer spacings $S_{xy}$ (measured between outer edges of outermost fingers, i.e., analogous to outer edges 621, 621' and 721, 731 of FIGS. 4 and 5, respectively) for a particular filter constructed on 64° LiNbO$_3$ (i.e., having Euler angles of 0, 26, 0), having a 1.35 micrometer (5.8 micrometer wavelength) inter-electrode spacing within the transducers and employing 0.15 micrometer thick aluminum metallization to provide a 4.5 dB bandwidth (relative to zero insertion loss, not center frequency insertion loss) of 30 MHz about a center frequency of 836.5 MHz and a center frequency insertion loss of 2.1 dB.

TABLE III

| $S_{xy}$ | SPACING | x | $N_x$ | y | $N_y$ |
|---|---|---|---|---|---|
| $S_{49,44}$ | 5.03192 | 49 | 50 | 44 | 69 |
| $S_{44,48}$ | 7.73197 | 44 | 69 | 48 | 42 |
| $S_{48,43}$ | 5.03192 | 48 | 42 | 43 | 59 |
| $S_{43,47}$ | 7.73197 | 43 | 59 | 47 | 42 |
| $S_{47,42}$ | 5.03192 | 47 | 42 | 42 | 65 |
| $S_{42,46}$ | 5.03192 | 42 | 65 | 46 | 47 |

The subscripts x and y refer to the transducer numbers assigned in FIG. 3 and associated text, for a 13 transducer structure that is essentially symmetrical about centerline 51. Input and output impedances are 50 Ω and the finger overlap (i.e., transverse to centerline 52) is roughly 79 micrometers or about 13.6 wavelengths.

Table IV provides another set of values (see also Table I) for number of finger pairs $N_{xy}$ and inter-transducer spacings $S_{xy}$ (measured between outer edges of outermost fingers, i.e., analogous to outer edges 621, 621' and 721, 731 of FIGS. 4 and 5, respectively) for a particular filter also constructed on 64° LiNbO$_3$, having a 1.234 micrometer (4.936 micrometer wavelength) inter-electrode spacing within the transducers and employing 0.15 micrometer thick aluminum metallization to provide a 4.5 dB bandwidth (relative to zero insertion loss, not center frequency insertion loss) of 30 MHz about a center frequency of 911 MHz and a center frequency insertion loss of 2.1 dB.

TABLE IV

| $S_{xy}$ | SPACING | x | $N_x$ | y | $N_y$ |
|---|---|---|---|---|---|
| $S_{49,44}$ | 4.6 | 49 | 48 | 44 | 65 |
| $S_{44,48}$ | 7.07 | 44 | 65 | 48 | 40 |
| $S_{48,43}$ | 4.6 | 48 | 40 | 43 | 55 |
| $S_{43,47}$ | 7.07 | 43 | 55 | 47 | 40 |
| $S_{47,42}$ | 4.6 | 47 | 40 | 42 | 61 |
| $S_{42,46}$ | 4.6 | 42 | 61 | 46 | 45 |

The subscripts x and y refer to the transducer numbers assigned in FIG. 3 and associated text, for a 13 transducer structure that is essentially symmetrical about centerline 51. Input and output impedances are 50 Ω and the finger overlap (i.e., transverse to centerline 52) is roughly 72.6 micrometers or about 14.7 wavelengths.

Similar filters may also be built on other high-coupling cuts (e.g., coupling coefficient greater than 5%) of LiNbO$_3$, LiTaO$_3$ and other materials, e.g., 36° LiTaO$_3$, 41° LiNbO$_3$, 64° LiNbO$_3$ and the like.

In FIG. 6, the "ground" of "common" terminals of the transducers lie on opposite sides of the longitudinal axis (parallel to propagation direction 52) of filter 80. These ground terminals are desirably all connected together by "hooking" or connecting the last ground finger of one transducer to the oppositely lying ground electrode of the next transducer. For example, left-most finger 622 of transducer 60, which extends from ground potential electrode 64, is connected by longitudinal conductor 751 to "ground" potential electrode 75 of transducer 70. Similarly, right-most electrode 622' which extends from "ground" potential electrode 64' of transducer 60' is connected to "ground" potential electrode 75 of transducer 70 by longitudinal conductor 752.

Figure 7:
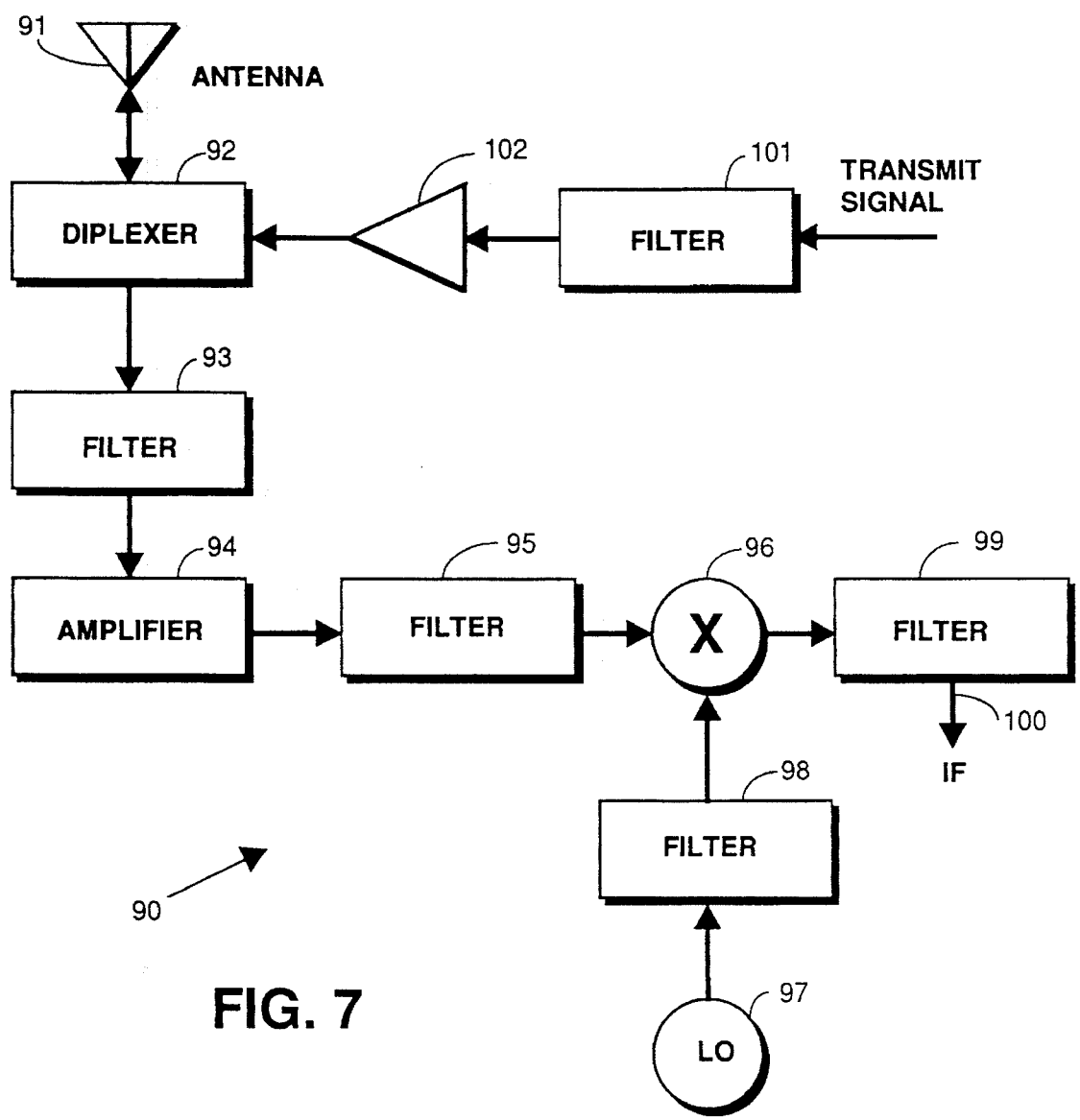
FIG. 7 shows a simplified schematic diagram of a radio employing multiple filters, as for example, one or more SAW filters according to the present invention.

FIG. 7 is a simplified schematic diagram indicating how the above-described filters according to the present invention are advantageously used in radio circuit 90. Radio circuit 90 comprises antenna 91 sending or receiving signals from optional diplexer 92 (which is coupled to the transmitter if one is used). Diplexer 92 sends an incoming signal to filter 93 which passes the resulting band limited signal to amplifier 94. From amplifier 94 the signal passes through another band limiting filter 95 to mixer 96. Mixer 96 also receives a signal from local oscillator 97 through band limiting filter 98. The mixed signal from mixer 96 passes through band limiting filter 99 which removes the local oscillator signal and sends the result to the receiver IF via output 100. Filter 101 cleans up the signal from the transmitter to reduce any surious out-of-band signals before they are amplified by power amplifier 102 and then directed via diplexer 92 to antenna 91 for transmission. Filter 101 is preferably a filter of the type described here and made according to the structure and method of the present invention.

Filters 93, 95, 98 and/or 101 are advantageously SAW filters of the type described here and made according to the structure and method of the present invention, but of varying frequency or other properties according to the particular desired function. For example, filter 93 removes input RF frequencies outside the band in which the receiver is intended to operate. This is particularly useful for narrow band receivers such as are frequently required in cellular phone and paging applications and the like.

Filter 95 may have the same or a different pass band than filter 93 and removes any undesired harmonics generated by amplifier 94 or other out-of-band signals not removed by filter 93. Filter 98 desirably passes the LO frequency and stops undesired harmonics thereof. Filter 99 desirably passes the difference frequencies produced by mixer 96, and blocks the local oscillator and input RF frequencies. This is important to avoid saturating the input stages of the IF amplifier which is typically coupled to output 100. Thus, electronic apparatus, and especially radios have improved properties as a result of the improved properties of the SAW filters of the present invention.

The above-described filters are constructed by a method comprising, in a first embodiment, providing a substrate for propagating acoustic waves and providing on the substrate a sequence of input transducers and output transducers, each transducer having a number of interdigitated electrode fingers, wherein the number of fingers in a first input or output transducer at or near a first end of the sequence is larger than the number of fingers in another input or output transducer more remote from the first end. Lithium niobate and lithium tantalate are examples of suitable substrate materials, with the former being preferred. The transducers are formed by depositing a conductive film, usually a metal such as aluminum, on the substrate and then by means of photomasking and etching steps well known in the art, unwanted portions of the metal film are removed. These metallization, masking and etching steps are conventional and well known in the art. What is different is the shape of the electrode pattern formed in the film. This is accomplished by providing an etch using an etch mask having an image of the electrode shape and arrangement described herein.

In a further embodiment there is provided a method comprising, providing a substrate for propagating acoustic waves and providing on the substrate a sequence of transducers having predetermined centerlines normal to the direction of acoustic wave propagation, wherein each centerline is located half way between outer edges of first and last electrode fingers of each transducer, and wherein centerlines of a first adjacent pair of transducers are a distance $D_1$ apart and centerlines of other adjacent pairs of transducers are distances $D_2$ to $D_{T-1}$ apart, where T is the number of transducers, and wherein at least one of $D_2$ to $D_{T-1}$ differs from $D_1$ by a non-integral number of wavelengths. It is further desirable that the foregoing step of providing transducers having the above-described centerline spacing and the step of providing transducers having numbers of fingers that vary along the transducer sequence in the above-described manner, be carried out simultaneously as a part of the metallization, masking and etching steps to define the transducer conductor pattern on the substrate.

It is further desirable that the step of providing the transducer comprises, providing a number of fingers in a first input (or output) transducer located at an end of the transducer array which is larger than a number of fingers in another input (or output) transducer further along the sequence, and in further detail, providing a sequence of transducers symmetrical about a centerline and wherein the number of fingers in a first input (or output) transducer located near an end of the array is larger than the number of fingers in another input (or output) transducer located nearest the centerline.

In a preferred embodiment, the step of providing the transducers comprises providing one transducer in the sequence containing an odd number of electrode fingers and an adjacent transducer containing an even number of electrode fingers, and further that the step of providing the transducers comprises providing an input transducer with an even numbers of electrode fingers and an output transducer with an odd number of electrode fingers, or vice versa as regards the designations of input and output. In a still further embodiment, the step of providing the transducers comprises providing an input transducer with an even number of electrode fingers and another input transducer with an odd number of electrode fingers, and providing an output transducer with an odd number of electrode fingers, or vice versa as regards the designations of input and output.

Based on the foregoing description, it will be apparent to those of skill in the art that the present invention solves the problems and achieves the goals set forth earlier, and has substantial advantages as pointed out herein, namely, having larger numbers of electrode fingers on the outboard transducers compared to the inboard transducers improves the power handling capability. Further, the arrangement of the present design provides greater design flexibility in optimizing the impedance and spectral response.

While the present invention has been described in terms of particular materials, structures and steps, these choices are for convenience of explanation and not intended to be limiting and, as those of skill in the art will understand based on the description herein, the present invention applies to other choices of materials, arrangements and process steps, and it is intended to include in the claims that follow, these and other variations as will occur to those of skill in the art based on the present disclosure.

I claim:

1. An electronic apparatus comprising a surface acoustic wave filter including a substrate comprising sixty four degree lithium niobate for propagating surface acoustic waves on which transducers are arrayed in a direction in which surface acoustic waves travel to form an array, the transducers comprising a plurality of input and a plurality of output transducers, each input and output transducer having a number of electrodes, wherein at least one of the input or output transducers located near an end of the array has a greater number of electrodes as compared to another input transducer located more centrally in the array, wherein a centerline-to-centerline separation of an adjacent pair of transducers differs from a centerline-to-centerline separation of another adjacent pair of transducers by a non-integral number of wavelengths of the surface acoustic wave, wherein a centerline of a transducer is located half way between outer edges of outer-most electrodes of that transducer.

2. An electronic apparatus as claimed in claim 1, wherein a central one of said input and output transducers includes an odd number of electrodes.

3. An electronic apparatus as claimed in claim 2, wherein said odd number comprises an integer having a value in the range from between thirty and sixty.

4. An electronic apparatus as claimed in claim 2, wherein said odd number comprises an integer having a value in the range from between forty four and forty eight.

5. An electronic apparatus as claimed in claim 2, wherein a first transducer immediately adjacent said central one is separated therefrom by a gap between an outermost edge of an outer electrode of said central one and an outermost edge of an adjacent outer electrode of said first transducer, said gap having a width in the range from three fourths to one wavelength.

6. An electronic apparatus as claimed in claim 2, wherein a first transducer immediately adjacent said central one is separated therefrom by a gap between an outermost edge of an outer electrode of said central one and an outermost edge of an adjacent outer electrode of said first transducer, said gap having a width of substantially eighty five percent of a wavelength.

7. An electronic apparatus as claimed in claim 2, wherein a first transducer immediately adjacent said central one is separated therefrom by a gap between an outermost edge of an outer electrode of said central one and an outermost edge of an adjacent outer electrode of said first transducer, said gap having a width of substantially ninety three percent of a wavelength.

8. An electronic apparatus as claimed in claim 2, wherein said surface acoustic wave filter includes a sequence of T input and output transducers including a plurality of input transducers and a plurality of output transducers, each having multiple interdigital electrode fingers wherein T is the number of electro-acoustic transducers and T is equal to an odd number between 6 and 25.

9. An electronic apparatus as claimed in claim 2, wherein said surface acoustic wave filter includes a sequence of T input and output transducers including a plurality of input transducers and a plurality of output transducers, each having multiple interdigital electrode fingers wherein T is the number of electro-acoustic transducers and T is equal to thirteen.

10. A surface acoustic wave filter comprising a sequence of T electro-acoustic transducers including a plurality of input transducers and a plurality of output transducers, each having multiple interdigital electrode fingers wherein T is the number of electro-acoustic transducers, and each electro-acoustic transducer has a predetermined number of interdigital electrode fingers, each electro-acoustic transducer comprising either an input or an output transducer, and an output transducer closer to an end of the sequence has more interdigital electrode fingers than another output transducer closer to the center of the sequence, a central transducer has an odd number of interdigital electrode fingers wherein said odd number is an odd number between thirty four and sixty and wherein a centerline-to-centerline separation of a first adjacent pair of transducers differs from a centerline-to-centerline separation of a second adjacent pair of transducers by a non-integral number of wavelengths of the surface acoustic wave, wherein a centerline of a transducer is located half way between outer edges of outer-most electrodes of that transducer.

11. A surface acoustic wave filter as claimed in claim 10, wherein T is an odd number.

12. A surface acoustic wave filter as claimed in claim 10, wherein said sequence of T electro-acoustic transducers are disposed on a substrate, said substrate including a substrate chosen from the group consisting of forty-one degree lithium niobate, thirty-six degree lithium tantalate and sixty-four degree lithium niobate.

13. A surface acoustic wave filter as claimed in claim 10, wherein said odd number is an odd number chosen from the group consisting of forty-five and forty-seven.

14. A surface acoustic wave filter as claimed in claim 10, wherein a transducer adjacent said central transducer includes a number of electrodes, said number chosen from the group consisting of sixty-one and sixty-five.

15. A method for forming an electronic apparatus comprising a filtering function, comprising steps of:

providing a substrate for propagating acoustic waves; and disposing on the substrate a sequence of input transducers and output transducers, each transducer having a number of interdigitated electrode fingers, wherein the number of fingers in a first input transducer at or near a first end of the sequence is larger than the number of fingers in another input transducer more remote from the first end, wherein a centerline-to-centerline separation of a first adjacent pair of transducers differs from a centerline-to-centerline separation of a second adjacent pair of transducers by a non-integral number of wavelengths of the surface acoustic wave, wherein a centerline of a transducer is located half way between outer edges of outer-most electrodes of that transducer.

16. A method as claimed in claim 15, wherein said providing step includes a step of providing a substrate chosen from the group consisting of forty-one degree lithium niobate, thirty-six degree lithium tantalate and sixty-four degree lithium niobate.

17. A method as claimed in claim 15, wherein said disposing step includes a step of disposing a central transducer in said sequence of input and output transducers, wherein said central transducer comprises an odd number of electrodes.

18. A method as claimed in claim 15, wherein said step of disposing a central transducer in said sequence of input and output transducers includes a step of disposing a central transducer including a number of electrodes wherein said number is chosen from the group of forty-five and/forty-seven.

19. A method as claimed in claim 15, wherein said disposing step includes steps of:

disposing a central transducer in said sequence of input and output transducers, wherein said central transducer is an input transducer; and disposing an output transducer adjacent said central transducer, wherein said adjacent output transducer includes a number of electrodes and wherein said number is chosen from the group consisting of sixty-one, sixty-three and sixty-five.

20. A method as claimed in claim 15, wherein said disposing step includes a step of disposing thirteen transducers in a linear array, wherein, starting from either end of said linear array, a first transducer includes forty-eight electrodes, a second transducer includes sixty-five electrodes, a third transducer includes forty electrodes, a fourth transducer includes fifty-five electrodes, a fifth transducer includes forty electrodes, a sixth transducer includes sixty-one electrodes and a seventh transducer includes forty-five electrodes.

* * * * *

UNITED STATES PATENT AND TRADEMARK OFFICE
CERTIFICATE OF CORRECTION

PATENT NO. : 5,463,361
DATED : October 31, 1995
INVENTOR(S) : Donald E. Allen

It is certified that error appears in the above-indentified patent and that said Letters Patent is hereby corrected as shown below:

Title page, under item [73], Assignee: [*] Notice, change "The portion of the term of this patent subsequent to May 3, 2011 has been disclaimed." to -- The portion of the term of this patent subsequent to November 18, 2011 has been disclaimed.--

Signed and Sealed this

Twelfth Day of March, 1996

Attest:

BRUCE LEHMAN

*Attesting Officer*    *Commissioner of Patents and Trademarks*